United States Patent
Lozhkin

(10) Patent No.: US 7,778,348 B2
(45) Date of Patent: Aug. 17, 2010

(54) TRANSMITTER FOR SUPPRESSING OUT-OF-BAND POWER FOR A SIGNAL

(75) Inventor: Alexander N Lozhkin, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 539 days.

(21) Appl. No.: 11/867,784

(22) Filed: Oct. 5, 2007

(65) Prior Publication Data

US 2008/0130767 A1    Jun. 5, 2008

(30) Foreign Application Priority Data

Nov. 30, 2006    (JP)    ............... 2006-324736

(51) Int. Cl.
*H04L 27/00*    (2006.01)
(52) U.S. Cl. .................. 375/295; 375/296; 455/114.2; 455/115.3; 327/180; 327/309
(58) Field of Classification Search ................ 375/146, 375/295, 296, 297; 455/43, 501, 63.1, 91, 455/114.2, 114.3, 115.1, 115.3; 327/50, 327/180, 309; 332/123, 125, 159
See application file for complete search history.

(56) References Cited

U.S. PATENT DOCUMENTS

| | | | |
|---|---|---|---|
| 6,292,054 B1 | 9/2001 | Ma et al. | |
| 6,624,694 B2 | 9/2003 | Ma et al. | |
| 7,212,583 B2 * | 5/2007 | Lindh | ..................... 375/296 |
| 7,415,251 B2 * | 8/2008 | Yoon | ..................... 455/114.2 |
| 7,574,189 B2 * | 8/2009 | Lozhkin et al. | .............. 455/308 |
| 7,664,472 B2 * | 2/2010 | Mosley et al. | .................. 455/91 |
| 2001/0035791 A1 | 11/2001 | Ma et al. | |
| 2005/0157812 A1 * | 7/2005 | Liu et al. | ..................... 375/296 |

FOREIGN PATENT DOCUMENTS

| | | |
|---|---|---|
| JP | 2001-189630 | 7/2001 |
| JP | 2002-368716 | 12/2002 |

* cited by examiner

*Primary Examiner*—Dac V Ha
(74) *Attorney, Agent, or Firm*—Katten Muchin Rosenman LLP

(57) ABSTRACT

A transmitter includes: a limiter performing clipping in which an amplitude part at a level higher than an amplitude level based on a predetermined clipping level is clipped from an input signal, separating the input signal into an input signal after the clipping, which contains a predetermined out-of-band component, and a clip signal clipped from the input signal through the clipping, and outputting the input signal after the clipping and the clip signal; a high-pass filter subjecting the clip signal inputted from the limiter to high-pass filtering for blocking an in-band component contained in the clip signal while passing an out-of-band component contained in the clip signal, which is opposite in phase to the out-of-band component contained in the input signal after the clipping; an adder performing an addition process on the out-of-band component received from the high-pass filter and the input signal after the clipping received from the limiter; and an amplifier performing power amplification on a signal outputted from the adder, and outputting the amplified signal.

7 Claims, 11 Drawing Sheets

FIG. 6 PRIOR ART

TABLE 1

| CR LEVEL [dB] | NUMBER OF ZERO SAMPLES IN CLIP(k) [%] | NUMBER OF NON-ZERO SAMPLES IN CLIP(k) [%] |
|---|---|---|
| 3 | 84 | 16 |
| 4 | 90 | 10 |
| 5 | 95 | 5 |
| 6 | 97.2 | 2.8 |

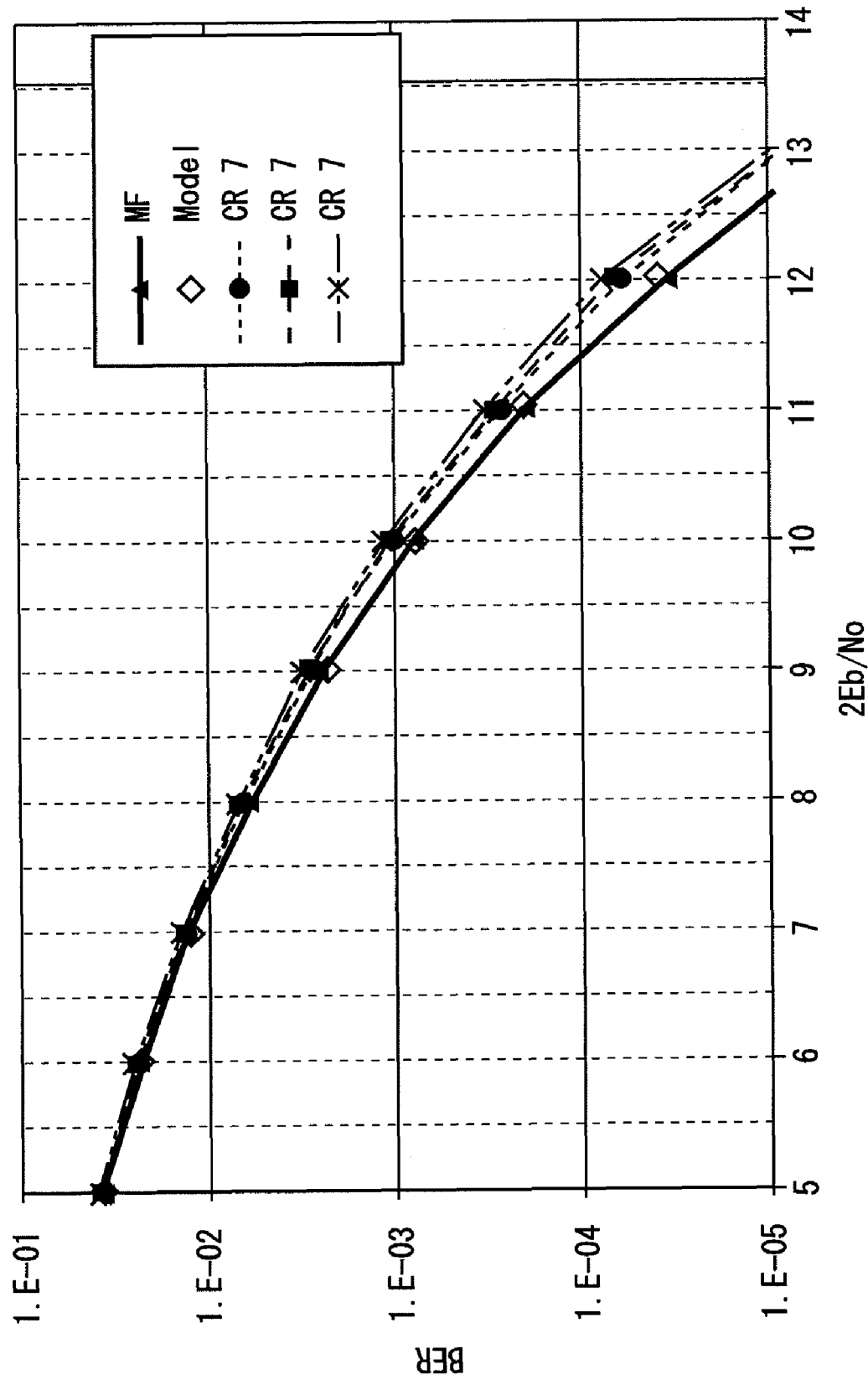

TRANSMITTER FOR SUPPRESSING OUT-OF-BAND POWER FOR A SIGNAL

BACKGROUND OF THE INVENTION

The present invention relates to a transmitter used for a communication system having a high peak-to-average power ratio (PAPR).

Known examples of a system having a high PAPR include an orthogonal frequency division multiplexing (OFDM) communication system. FIG. 1 shows a typical OFDM transmitter. As shown in FIG. 1, the OFDM transmitter includes: a serial-to-parallel converter (S/P) 1 for performing serial-to-parallel conversion on an input bit stream (source of data to be transmitted); an inverse fast Fourier processor (IFFT) 2 having a size of M; a parallel-to-serial converter (P/S) 3; an oversampling block (interpolator) (OS) 4; a digital-to-analog converter (DAC) 5; an output low-pass filter (LPF) 6; an RF up converter (RF) 7; and a high-power amplifier (HPA) 8 that operates in class A or class A-B.

The OFDM transmitter shown in FIG. 1 generates an OFDM signal having a high PAPR level. In order to amplify the high-PAPR OFDM signal, it is necessary to employ a high input back-off level linear amplifier that operates in class A or class A-B. However, the amplifier of this type is low in power efficiency.

The simplest approach to reducing a PAPR of the OFDM signal is to clip (cut out) high amplitude peaks thereof. A variety of clipping techniques have been proposed. In some of the techniques, outputs of an inverse fast Fourier transform (IFFT) are clipped before interpolation (oversampling (OS)). However, the signal must be interpolated before digital-to-analog conversion, thus causing peak re-growth. To avoid the problem of peak re-growth, the signal may be clipped after interpolation. However, such the scheme causes extremely significant out-of-band power.

Examples of approaches for reducing the out-of-band power to a desired level include a PAPR reducing scheme for effecting such filtering as described below, which enables reduction of the out-of-band power to a desired level. FIG. 2 shows a configuration example of an OFDM transmitter (conventional example) to which the PAPR reducing scheme using a "clipping and filtering method" is applied.

The OFDM transmitter shown in FIG. 2 is provided with: an IFFT 9 in place of the IFFT 2 shown in FIG. 1; a limiter 10 to which an output (OFDM signal) from the P/S 3 is inputted; and an LPF 11 to which an output from a limiter 10 is inputted, the LPF 11 being connected to the DAC 5.

First, an input vector (input bit stream) is converted from a frequency domain to a time domain by using an oversize IFFT 9. In a case where an oversampling factor of the IFFT 9 is K, the input vector is extended by adding M×(K−1) zeros in the middle of the vector. As a result, trigonometric interpolation is performed in the time domain. The oversampled or interpolated signal is then clipped at the limiter 10. In the limiter 10, hardware-limiting is applied to the amplitude of the complex values x at the IFFT output.

[Expression 1]

$$\text{Limiter input: } S(t) = \rho \cdot \exp(j \cdot \phi) \quad (1)$$

$$\text{Limiter output: } S^*(x) = \begin{cases} S(t) & \text{for } \rho < A \\ A \cdot \exp(j \cdot \phi) & \text{for } \rho > A \end{cases}$$

$$\text{Clip}(t) = S(t) - S^*(t)$$

In Expression 1, A is a clipping level or a clipping ratio (CR), Clip(t) is a clip signal (difference between an original signal and a signal as an output from the limiter 10), and S(t) is an (unclipped) OFDM signal. Note that both x and y are complex values.

The clipping ratio CR is defined as a ratio of the clipping level to mean (average) power of an unclipped baseband signal. After the clipping, the LPF 11 performs frequency-domain low-pass filtering to effect waveform shaping and reduction in out-of-band power.

FIG. 3 shows a cumulative distribution function (CCDF) of the OFDM transmitter shown in FIG. 2 in terms of different clipping levels (CR). In simulations shown in FIG. 3, a modulation scheme is quadrature phase shift keying (QPSK), where M=64 and K=2. A plotted (dotted) graph that corresponds to an OFDM transmission scheme (OFDM transmitter) shown in FIG. 1 is indicated by "OFDM" in FIG. 3. The filtering performed by the LPF 11 exhibits some peak re-growth (see FIG. 3). More compact CCDF is preferable in order to reduce a dynamic range of the HPA 8 and increase power efficiency of the HPA 8.

To remove the resulting out-of-band power, the clip signal is filtered in the LPF 11. In the conventional example, a filter unit is composed of a pair of larger FFT and IFFT modules. A filter task is based on a finite-impulse response (FIR) with 103 coefficient and recursive filters. The FIR is implemented by convolution summation.

[Expression 2]

$$y(n) = \sum_{k=0}^{N-1} h(k) \cdot x(n-k) \quad (2)$$

In Expression 2, y(n) is an FIR output signal, x(n) is an FIR input signal, h(n) is unit samples of the FIR, and N is a length of the FIR (number of filter taps).

FIG. 4 shows a structure of an FIR digital filter based on Expression 2. In order to implement Expression 2, the FIR digital filter includes: a plurality of delay units for obtaining sample values from the FIR input signal x(n); a plurality of multipliers for multiplying the sample values by predetermined constants (weighting factors $h_0, h_1, \ldots, h_{N-1}$); and a plurality of adders for obtaining the FIR output signal y(n) by summing up outputs from the plurality of multipliers. By control of the constants (weighting factors) given to the multipliers, the FIR digital filter may constitute an LPF or an HPF. The LPF 11 shown in FIG. 2 is formed of the FIR digital filter to remove out-of-band components from a main signal (to reduce out-of-band power).

As can be seen from FIG. 4, the number of multiplication operations for an FIR with N taps equals N. In an OFDM system using a large number of subcarriers, in order to obtain strong out-of-band power suppressions (typically, −50 to −80 dB), the total number of the weighting factors for the FIR must be large. For example, FIG. 5 shows a level of the out-of-band power suppressions (ATT) expressed in dB for a WiMAX system with 2048 subcarriers when clipping level equals 4 dB and the number of taps N of the FIR as a parameter.

In the plotted (dotted) graph of FIG. 5, as the length of the FIR (number of taps N) increases, the out-of-band power suppression further improves. Thus, according to the simulation results shown in FIG. 5, the FIR with 512 taps provides satisfactory out-of-band power suppression. On the other hand, it is obvious that FIRs with less than 512 taps provide unsatisfactory out-of-band power suppression.

In a case of implementing the FIR digital filter with an application specific integrated circuit (ASIC) implementation or a field programmable gate array (FPGA) implementation, it is necessary to provide a large number of 8-bit multipliers corresponding to the number of taps N. The 8-bit multiplier is about 8 times more complex than the adder. Thus, the conventional example has a problem in that the FIR digital filter becomes larger and more complex. There is another problem in that the FIR digital filter requires more time for a low-pass filtering process.

In addition to the OFDM transmitters shown in FIGS. 1 and 2, prior art with respect to the present invention includes techniques described in the following related art documents.

[Patent document 1] JP 2001-189630 A
[Patent document 2] JP 2002-368716 A

SUMMARY OF THE INVENTION

The present invention has an object to provide a technique capable of reducing a PAPR in a communication system employing a modulation process exhibiting a high PAPR, and capable of simplifying a filtering process for suppressing out-of-band power.

The present invention adopts the following means in order to achieve the objects.

That is, the present invention provides a transmitter, including:

a limiter performing clipping in which an amplitude part at a level higher than an amplitude level based on a predetermined clipping level is clipped from an input signal, separating the input signal into an input signal after the clipping, which contains a predetermined out-of-band component, and a clip signal clipped from the input signal through the clipping, and outputting the input signal after the clipping and the clip signal;

a high-pass filter subjecting the clip signal inputted from the limiter to high-pass filtering for blocking an in-band component contained in the clip signal while passing an out-of-band component contained in the clip signal, which is opposite in phase to the out-of-band component contained in the input signal after the clipping;

an adder performing an addition process on the out-of-band component received from the high-pass filter and the input signal after the clipping received from the limiter; and an amplifier performing power amplification on a signal outputted from the adder, and outputting the amplified signal.

In the present invention, in order to reduce a peak-to-average power ratio (PAPR) of a transmission signal amplified by the amplifier, the clipping performed by the limiter is followed by the high-pass filtering process for extracting the out-of-band component contained in the clip signal. Then, a combining process (addition process) is performed to combine a high-pass filtered output (out-of-band component) obtained through the above-mentioned high-pass filtering process with the input signal that has undergone the clipping, so the out-of-band component contained in the input signal that has undergone the clipping is canceled by the high-pass filtered output. Accordingly, by removing the out-of-band component from the input signal, it is possible to reduce (suppress) out-of-band power amplified by the amplifier, and also possible to achieve PAPR reduction.

Preferably, in the transmitter according to the present invention:

the clip signal contains sample values indicating amplitude values at a plurality of sample points;

the high-pass filter is configured to perform a high-pass filtering process including an addition process of adding a plurality of multiplication results after performing a multiplication process of multiplying each sample value by a predetermined weighting factor; and the transmitter further includes a multiplication control section controlling the high-pass filter to perform the multiplication process so that the multiplication process relating to a zero sample value is avoided in the high-pass filtering process.

With this configuration, the multiplication process for a portion with the sample value being zero is omitted in the high-pass filtering process. This simplifies the high-pass filtering process, which leads to simplification or size-reduction of the structure of the high-pass filter. In addition, it is possible to shorten the time necessary for the high-pass filtering process.

Preferably, in the transmitter according to the present invention, the input signal after the clipping is outputted from the adder substantially without frequency distortion.

Preferably, in the transmitter according to the present invention, the high-pass filter performs the multiplication process using the weighting factor only on a non-zero sample value contained in the clip signal.

Preferably, in the transmitter according to the present invention, the clipping level defines the number of non-zero sample values contained in the clip signal.

Further, according to the present invention, there can be implemented a method for PAPR reduction using a transmitter which has the same features as the above-mentioned transmitter.

According to the present invention, in a communication system (a transmitter) employing the modulation process exhibiting a high PAPR, it is possible to reduce a PAPR and to simplify a filtering process for suppressing out-of-band power.

BRIEF DESCRIPTION OF THE DRAWINGS

FIG. 6 shows a table showing relationships between a clipping level CR and a zero value sample and non-zero value sample that are contained in a clip signal Clip(k).

FIG. 9 shows a graph representing BER performances of the OFDM signal after a clipping and filtering process at the OFDM transmitter shown in FIG. 6.

DETAILED DESCRIPTION OF THE EMBODIMENT

Hereinafter, description will be made of an embodiment of the present invention with reference to the drawings. Components of the embodiment are mere examples, and the present invention is not limited to the embodiment.

[Outline of the Invention]

One of main disadvantages of OFDM is its high peak-to-average power ratio (PAPR). Therefore, OFDM transmitters require output amplifiers having high linearity and a wide dynamic range. Those amplifiers are expensive and inefficient. Nonlinearity of the amplifiers causes intermodulation products, resulting in unwanted out-of-band power.

Figure 5:
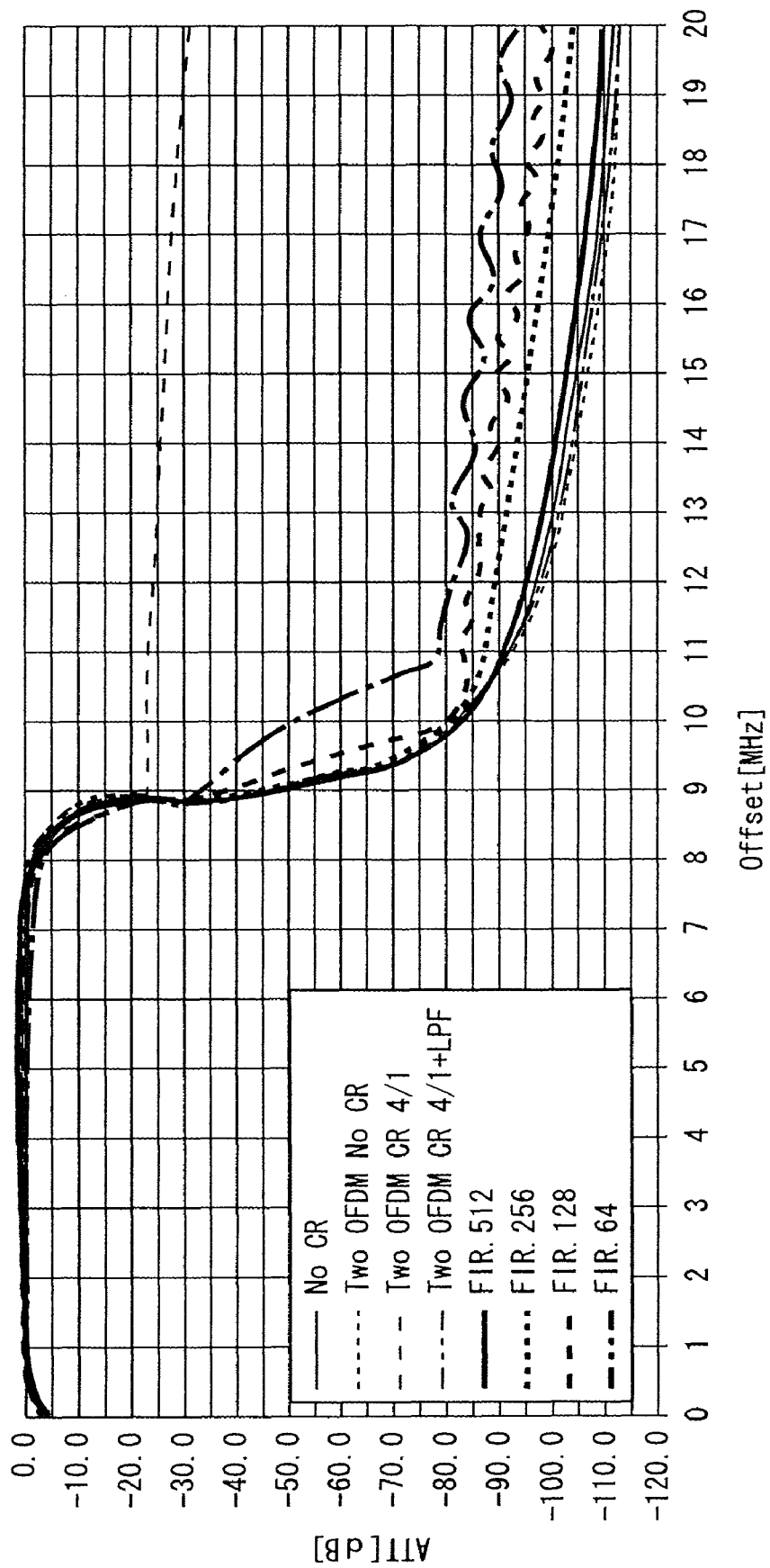
FIG. 5 shows a graph representing a level of an out-of-band power suppression for different numbers of taps in the FIR digital filter.

The simplest approach to reducing the PAPR of an OFDM signal is to clip (cut out) high amplitude peaks thereof. However, to prevent an increase in out-of-band power, it is necessary to provide an additional low-pass filter (LPF) (in FIG. 2, LPF 11). To obtain a strong out-of-band power suppression (normal value: −50 to −75 dB), the LPF must have an extremely long pulse response (for example, 512 taps or more in the example of FIG. 5). This significantly increases the number of multiplications performed during a low-pass filtering process. With a configuration of the OFDM transmitter shown in FIG. 2, repetitions of clipping and filtering increase the number of their operations several-fold.

In a system according to the present invention, the low-pass filtering process is replaced by a set of high-pass filtering and a combination process. The replacement may reduce the number of total multiplications performed in a filter to approximately one-tenth or less depending on a selected clipping level. Accordingly, in a case of implementing the filter with, for example, an FPGA (Field Programmable Gate Array) implementation, it becomes possible to greatly reduce the number of FIR gates. Alternatively, in a case of implementing the FIR digital filter as software, it becomes possible to greatly reduce the number of digital signal processor (DSP) clocks. Further, it is possible to increase the number of repetitions of the "clipping and filtering" process without significant latency growth.

Disclosed as an embodiment of the present invention is an improvement in PAPR reduction for general OFDM-based communication systems. The improvement is attained by using the following techniques.

(1) An OFDM signal is separated (split) into two parts, that is, a clip part Clip(t) and a main signal S*(t)=S(t)−Clip(t) at a limiter output.

(2) Following high-pass filtering of only the clip part Clip (t), the high-pass filtered signal is combined with a limiter output signal.

Figure 3:
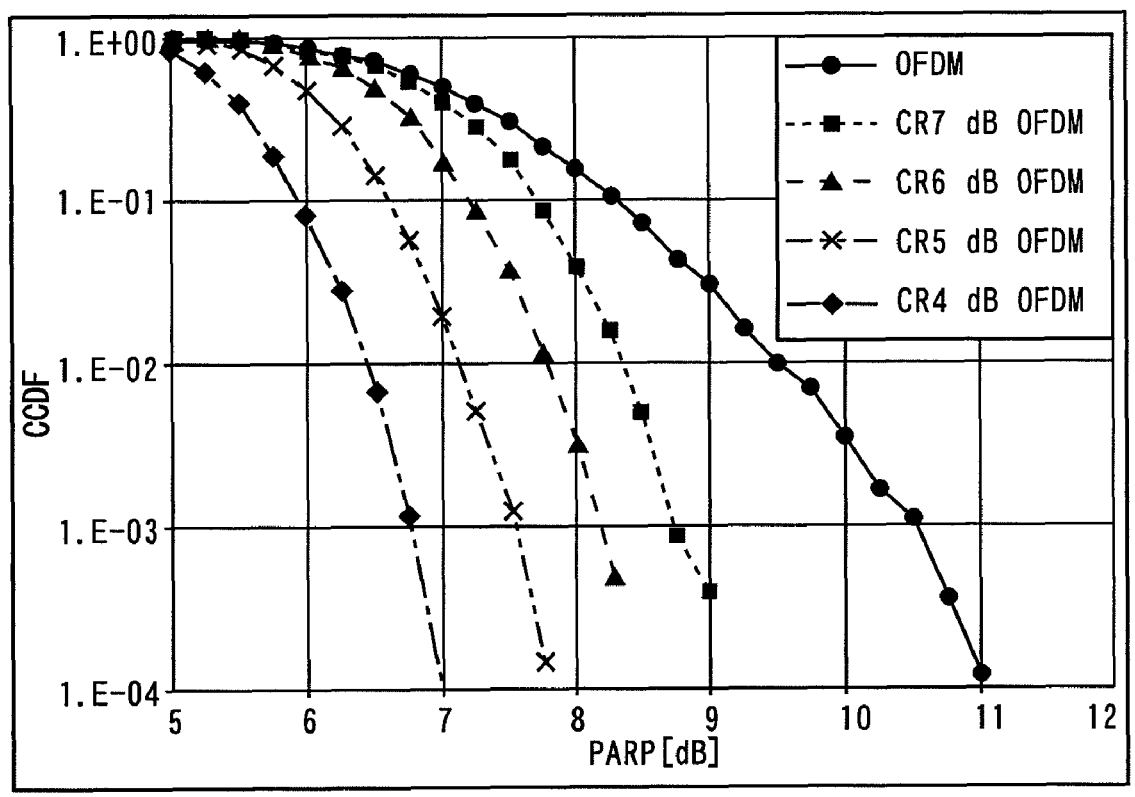
FIG. 3 shows a graph representing a CCDF function of the OFDM transmitter (conventional example) shown in FIG. 2.

(3) According to Expression 1, the clip signal has non-zero values only in a case where the original OFDM signal exceeds the clipping ratio CR. Thus, according to the CCDF as shown in FIG. 3, for most practical CR values (3 to 6 dB), the probabilities exceeding the PAPR level are relatively low. Therefore, the clip signal contains a large number of zero value samples (see the table shown in FIG. 6) together with a few non-zero samples. In the table of FIG. 6, the percentages of the zero value samples at the clipping level CR=3, 4, 5, and 6 are shown as 84%, 90%, 95%, and 97.2%, respectively.

(4) In Expression 2, an FIR (LPF) output represents a linear combination of an input signal (Clip(k)) with an appropriate coefficient h(k). As described above, most sample values of the signal Clip(k) are zero. Therefore, a multiplication value Clip(k)·h(k) can be obtained while omitting multiplication processes relating to all the zero value samples contained in the signal Clip(k). This case involves no penalty in out-of-band power suppression.

[Configuration Example of an OFDM Transmitter]

Figure 7:
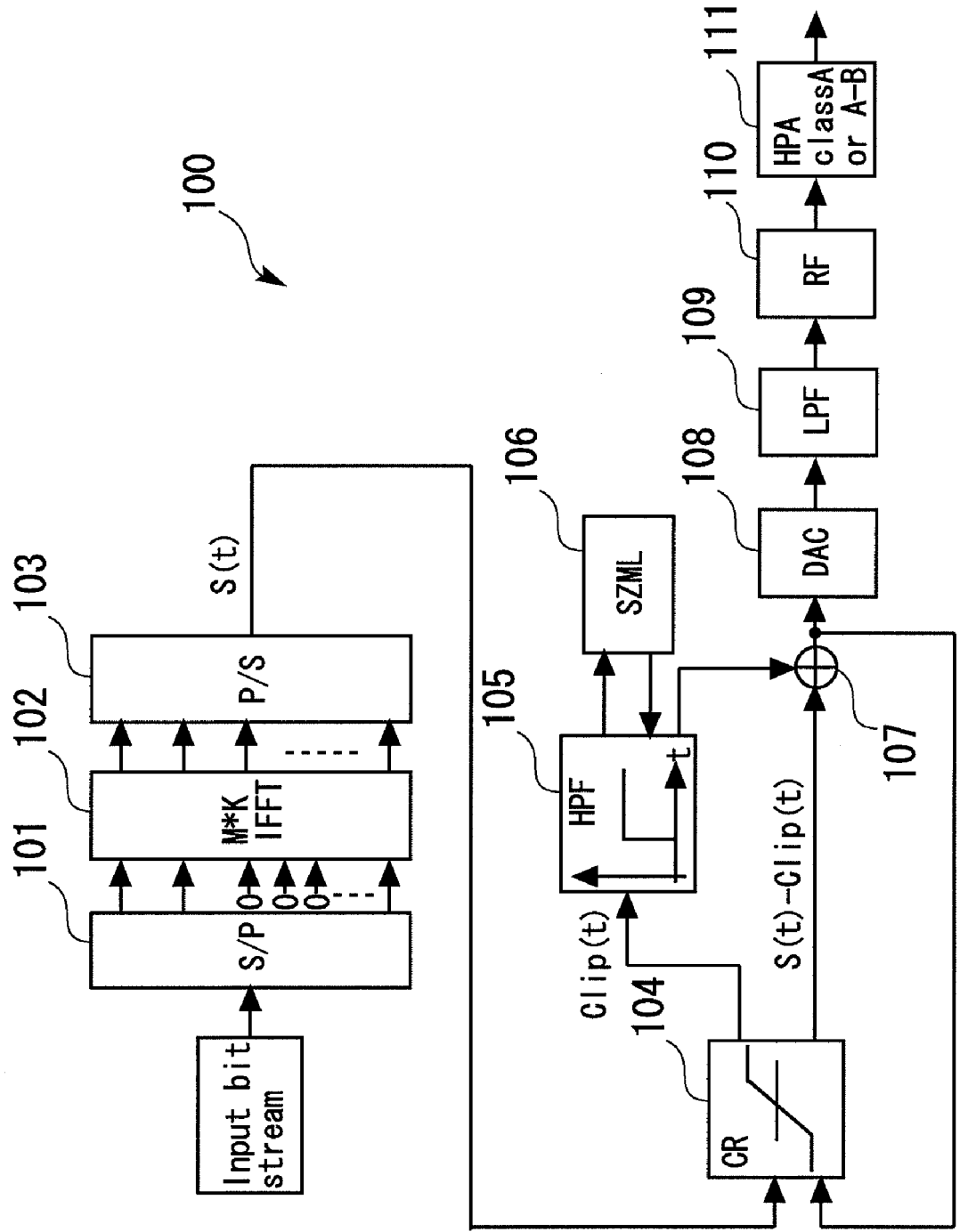
FIG. 7 shows a configuration example of an OFDM transmitter according to an embodiment of the present invention.

FIG. 7 shows a configuration example of an OFDM transmitter applied to the OFDM communication system according to the embodiment of the present invention.

Referring to FIG. 7, an OFDM transmitter 100 includes: a serial-to-parallel converter (S/P) 101 to which a source of data (input bit stream) is inputted; an inverse fast Fourier processor (IFFT processor) 102 (including an oversampling block (interpolator (OS) section) based on a zero-padding IFFT or an LPF interpolator circuit); a parallel-to-serial converter (P/S) 103; a limiter (limiting unit) 104 having a predetermined clipping ratio CR; a high-pass filter (HPF, HPF unit) 105; a skip zero multiplication logic section (SZML section; multiplication control section) 106; and a combiner (adder, adding unit) 107. The S/P 101, the IFFT processor 102, and the P/S 103 may be constituted by the same components as the S/P 1, the IFFT processor 9, and the P/S 3 shown in FIG. 2, respectively.

Further, the OFDM transmitter 100 includes: a digital-to-analog converter (DAC) 108 for performing digital-to-analog conversion on a signal outputted from the adder 107; a low-pass filter (LPF) 109 for performing waveform shaping on a signal outputted from the DAC 108; an RF up converter 110 for up-converting a frequency of a signal outputted from the LPF 109 into an RF frequency; and a high power amplifier (HPA (amplifier or amplifying unit) 111 for amplifying power of a signal outputted from the RF up converter 110 to output the amplified signal. An output (OFDM signal) from the HPA 111 is emitted through a transmission antenna (not shown) and received by the receiver (not shown).

Figure 1:
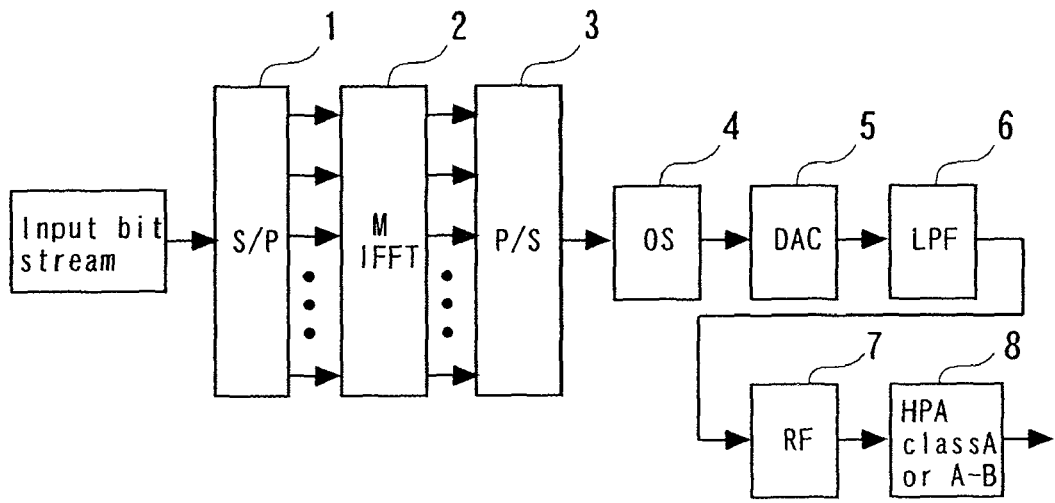
FIG. 1 shows a standard OFDM transmitter.
Figure 2:
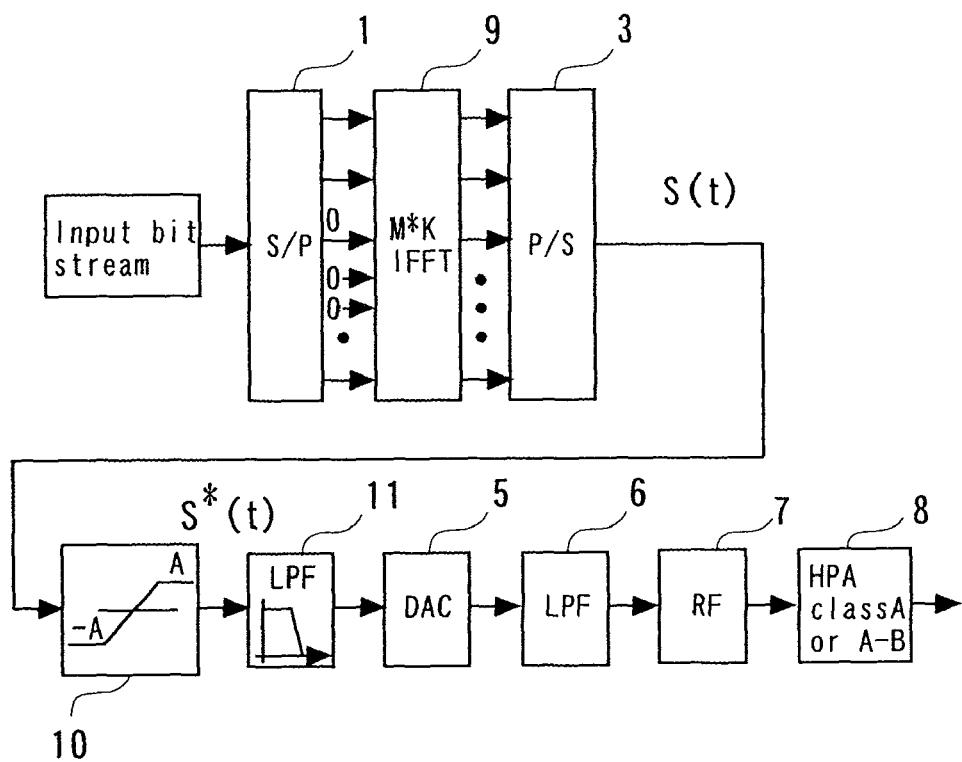
FIG. 2 shows a configuration example of an OFDM transmitter for implementing clipping and filtering to reduce a PAPR.

The DAC 108, the LPF 109, the RF up converter 110, and the HPA 111 may be constituted by the same components as the DAC 5, the LPF 6, the RF up converter 7, and the HPA 8 shown in FIG. 2, respectively. In addition, the limiter 104 may be constituted by the same component as the limiter 10 shown in FIG. 2. Note that the LPF 109 may be omitted.

Referring to FIG. 7, an original OFDM signal (main signal S(t)) outputted from the P/S 103 is inputted to the limiter 104. The main signal S(t) corresponds to an OFDM signal that has undergone S/P conversion performed by the S/P 101 with respect to an input data stream, inverse Fourier transform and interpolation processing performed by the IFFT 102, and P/S conversion performed by the P/S 103. The limiter 104 operates according to a rule expressed by Expression 3. In Expression 3, CR is a clipping level.

[Expression 3]

$$\text{Input } S(k) = \rho \cdot \exp(j \cdot \phi) \qquad (3)$$
$$\text{Output } S^*(k) = \begin{cases} S(k) & \text{for } S(k) < CR \\ A \cdot \exp(j \cdot \phi) & \text{for } S(k) > CR \end{cases}$$

Further, the clip signal (Clip(k)) that is clipped based on the clipping level CR by the limiter 104 can be expressed by Expression 4 as follows.

$$Clip(k)=S(k)-y(k) \quad (4)$$

where y(k)=S*(k). Further, the OFDM signal (S*(t)) outputted from the limiter 104 can be expressed by Expression 5 as follows.

$$S^*(t)=S(t)-Clip(t) \quad (5)$$

Thus, the limiter 104 performs clipping on the inputted main signal S(t) based on the clipping level CR. To be specific, the limiter 104 performs clipping to clip (cut out) an amplitude part at a level higher than an amplitude level based on the clipping level CR from the OFDM signal. Accordingly, the OFDM signal S(t) being the input signal to be transmitted is separated into the OFDM signal S*(t) that has undergone clipping (input signal after clipping) and the clip signal (clip part) Clip(t)=S(t)−S*(t).

The limiter 104 outputs the OFDM signal S*(t) and the clip signal Clip(t). The OFDM signal (main signal) S*(t) is inputted to the adder 107, while the clip signal Clip(t) is inputted to the HPF 105. A high-pass filtering process performed by the HPF 105 is controlled by the SZML section 106, and an output from the HPF 105 is inputted to the adder 107. An output from the adder 107 is inputted to the DAC 108 as well as being fed back to the limiter 104.

Figure 8A:
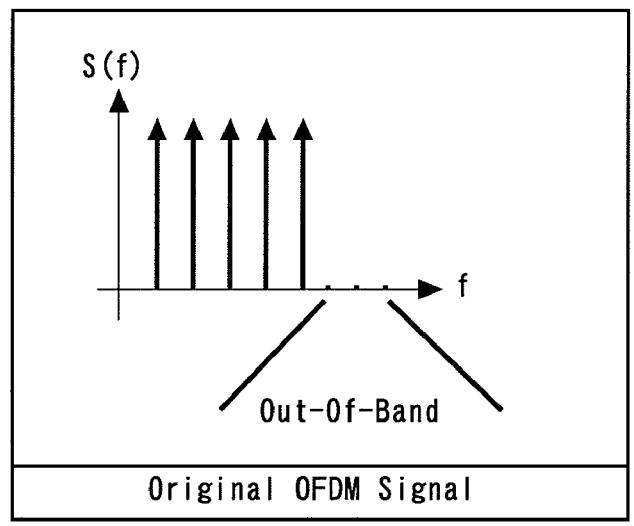
FIG. 8A shows a spectrum (S(f)) of an original OFDM signal (main signal) inputted to the limiter.
Figure 8B:
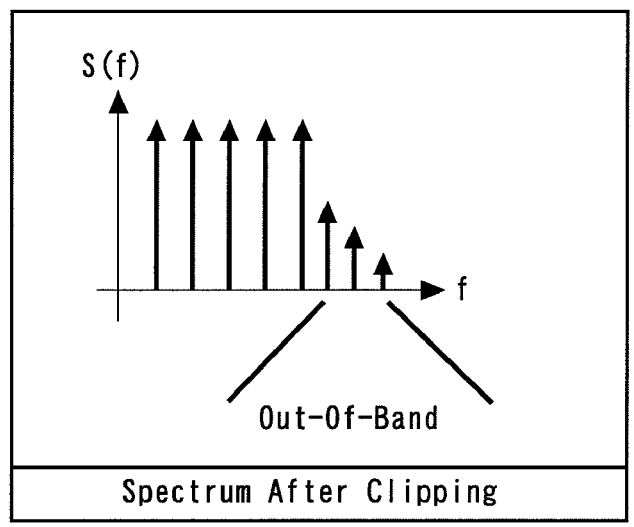
FIG. 8B shows a spectrum (S*(f)) of the main signal outputted from the limiter.
Figure 8C:
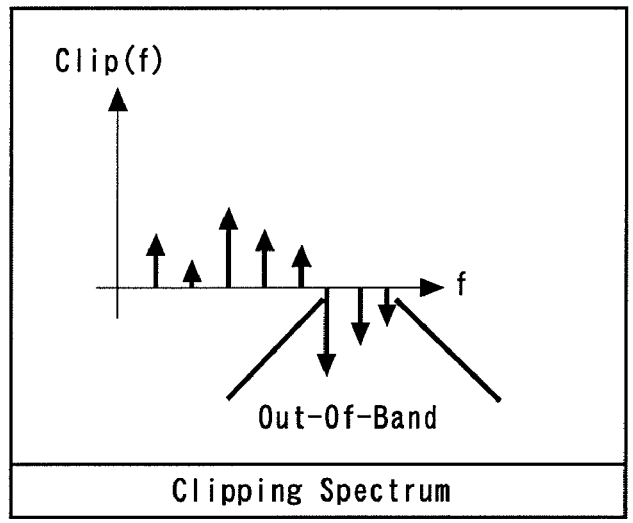
FIG. 8C shows a spectrum (Clip(f)) of the clip signal Clip (k).
Figure 8D:
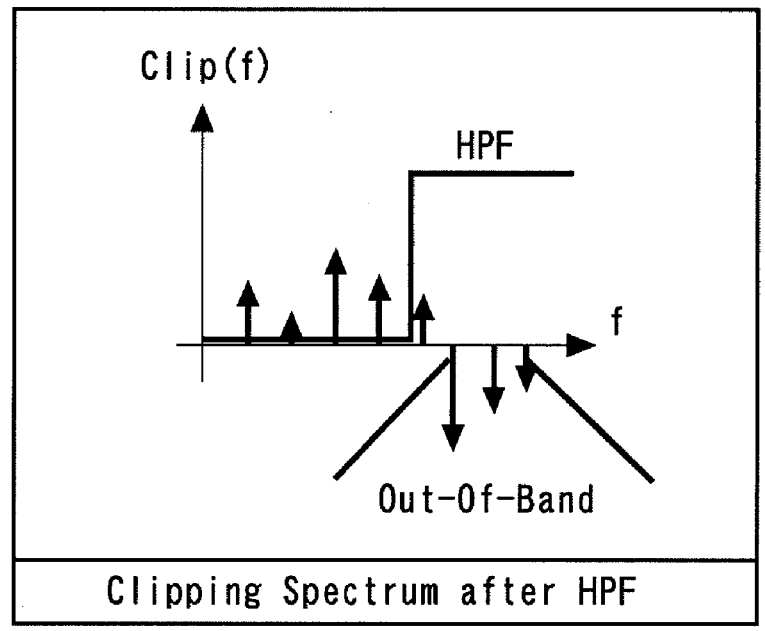
FIG. 8D shows a spectrum of the clip signal that has passed the HPF.
Figure 8E:
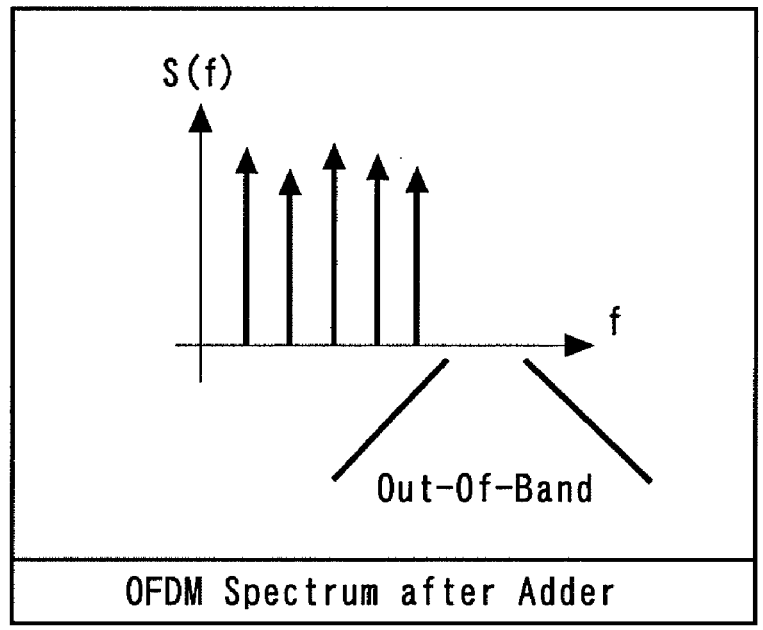
FIG. 8E shows a spectrum (S*(f)) of the OFDM signal that has undergone an addition process at the adder.

FIGS. 8A to 8E show signal spectrums exhibited at different points of an OFDM system (OFDM transmitter 100) shown in FIG. 7. To be specific, FIG. 8A shows a spectrum (S(f)) of the original OFDM signal (main signal) inputted to the limiter 104. FIG. 8B shows a spectrum (S*(f)) of the main signal outputted from the limiter 104. FIG. 8C shows a spectrum (Clip(f)) of the clip signal Clip(k). FIG. 8D shows a spectrum of the clip signal that has passed the HPF 105. FIG. 8E shows a spectrum (S*(f)) of the OFDM signal that has undergone an addition process at the adder 107.

When the original OFDM signal S(k) (FIG. 8A) is clipped at the limiter 104, the OFDM signal S*(k) outputted from the limiter 104 contains out-of-band components (predetermined out-of-band components) having a band higher than that of the OFDM signal (FIG. 8B). Meanwhile, the out-of-band components of the main signal in the clip signal Clip(k)=S(k)−S*(k) exhibit a phase opposite to the out-of-band components of the output from the limiter 104, that is, the OFDM signal S*(k)=S(k)−Clip(k). In other words, the clip signal Clip(k) contains out-of-band components having a phase shift π (FIG. 8C).

The HPF 105 is constructed to allow the out-of-band frequencies to pass while blocking in-band frequencies (FIG. 8D). The output signal (out-of-band components) from the HPF 105 and the OFDM signal S*(k) are subjected to the addition process (combined) at the adder 107.

At this time, the out-of-band components of the OFDM signal S*(t) and the signal outputted from the HPF 105 are opposite in phase (have a phase difference of π), so the out-of-band components of the OFDM signal S*(t) are canceled by the signal outputted from the HPF 105. Accordingly, an out-of-band power level due to the out-of-band components of the OFDM signal outputted from the adder 107 becomes equal to an out-of-band power level for the original OFDM signal S(t) (before clipping). In other words, the out-of-band power is reduced (suppressed).

Figure 4:
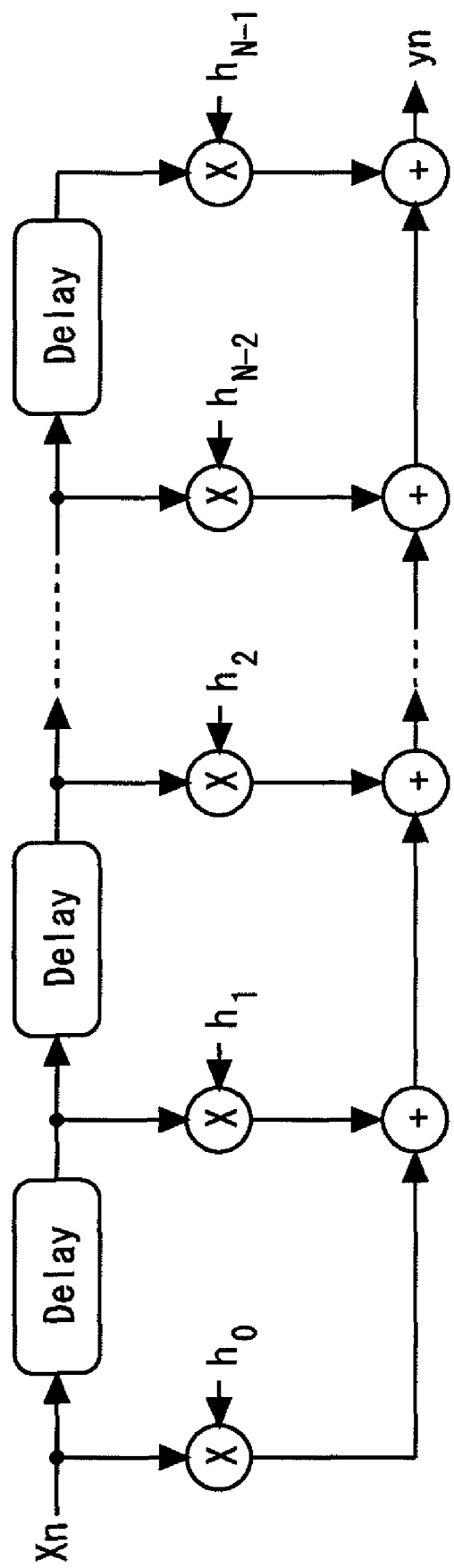
FIG. 4 shows a schematic diagram of a structure of an FIR digital filter.

Accordingly, the HPF 105 and the adder 107 according to the embodiment collectively function as an LPF for removing out-of-band components from the OFDM signal S*(t) that has undergone clipping. Further, the SZML section (multiplication control system) 106 functions as follows. The SZML section 106 receives the clip signal Clip(k) inputted to the HPF 105 and judges which of zero and non-zero a value (signal amplitude) of each sample contained in the clip signal represents. Most samples contained in the clip signal Clip(k) outputted from the limiter 104 have a zero value. The HPF 105 is implemented by the FIR digital filter as shown in FIG. 4.

Based on results of the judgment, the SZML section 106 stops or omits the multiplication process of a multiplier to which a zero sample value is to be inputted in the high-pass filtering process performed on the clip signal by the HPF 105. In an example case where the FIR digital filter is implemented by an ASIC, the SZML section 106 applies an enable signal only to a multiplier to which a non-zero sample value is to be inputted, and disables an operation of the multiplier to which a zero sample value is to be inputted. This reduces the number of multiplications for high-pass filtering and simplifies the high-pass filtering process. Accordingly, the low-pass filtering process for PAPR reduction is simplified in turn.

In an alternative case where the FIR digital filter is implemented by the FPGA, the SZML section 106 constructs such an FIR digital filter as to avoid the multiplication process relating to the zero sample value. This reduces the number of FIR gates and simplifies the high-pass filtering process (number of multiplications) performed by the FIR digital filter. Alternatively, if the FIR digital filter is implemented by software executed by a processor (e.g., DSP) included in the HPF 105, the processor is controlled to perform the high-pass filtering process with the multiplication process for the zero sample value being omitted.

As described above, the SZML section 106 controls the HPF 105 to perform the multiplication process so that the multiplication process relating to the zero sample value is avoided and only the multiplication process relating to the non-zero sample value is executed. This simplifies the high-pass filtering process (multiplication process). In addition, it is possible to achieve reduction in the processor clock frequency of the processor (DSP). The SZML section 106 may be implemented by a computer including a processor (e.g., CPU) and a memory or by a hardware logic.

The simplified high-pass filtering process allows reduction of a time required for the low-pass filtering performed by the HPF 105 and the adder 107. Therefore, the clipping and filtering process (PAPR reduction process) can repeatedly be performed in a short cycle by the limiter 104, the HPF 105, and the adder 107.

Note that there is an alternative configuration in which the OFDM transmitter 100 does not include the SZML section 106. Even in this case, the zero value of a sample contained in the clip signal is multiplied by the weighting factor (constant) merely to obtain zero, which simplifies the operation for the filtering. A load and time for the filtering process can be made lower and shorter than in the case of performing the low-pass filtering on the OFDM signal that has undergone the clipping (conventional example).

The technique according to the embodiment of the present invention causes a significant increase in clipping noise components within a bandwidth of the OFDM signal. However, the resultant deterioration becomes smaller than expected owing to two effects. First, in clipping the main signal, noise components are added to the main signal, and an entire constellation size is reduced. However, the reduction in constellation size is corrected by normalizing a total signal output power, which prevents an increase in bit error rate (BER) Second, the remaining clipping noise is added not at a receiver but at a transmitter. Therefore, in a fading channel, the clipping noise fades along with the signal. Accordingly, an influence of the clipping noise is by far smaller than that of the noise added at the receiver, which does not fade.

FIG. 9 shows a bit error rate (BER) measured in an additive Gaussian noise (AWGN) channel in the case of adopting the OFDM transmitter 100. FIG. 9 also shows a theoretical BER for undistorted OFDM (solid line, MF=matched filter). For QPSK modulation, the clipping noise causes negligible (under 0.25 dB) degradation in BER. Therefore, according to the OFDM transmitter 100, the adder 107 outputs an OFDM signal having substantially little frequency distortion, which makes it possible to suppress degradation in BER due to the clipping noise.

[Specific Example]

As described above, the OFDM transmitter shown in FIG. 7 is implemented with high-pass filtering for PAPR reduction and out-of-band power suppression. The M OFDM samples of every OFDM block are independent identically-distributed Gaussian random variables. Such statistical independence is responsible for high variability of the OFDM signal, making its PAPR extremely high.

Figure 10:
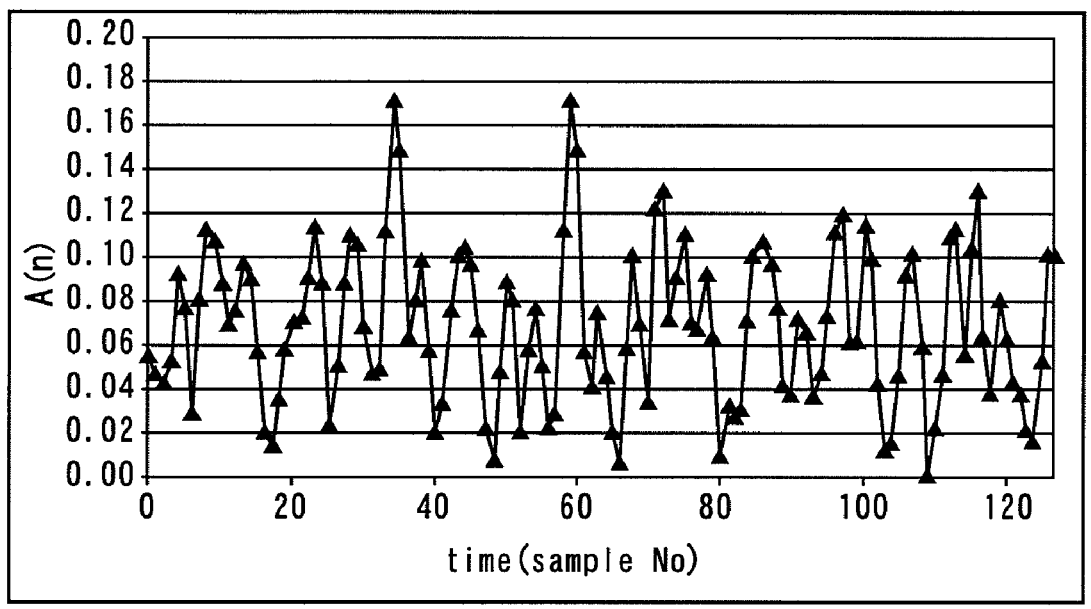
FIG. 10 shows a diagram of an example of the OFDM signal (main signal S(n)) to be subjected to the clipping and filtering process.

As an example, an OFDM block signal (M=64, K=2, and M*K=128) amplitude A(n) at the IFFT processor 102 is shown in FIG. 10 as a function derived from an OFDM sample number n. That is, FIG. 10 shows the OFDM signal S(n) to be inputted to the limiter 104.

Figure 11:
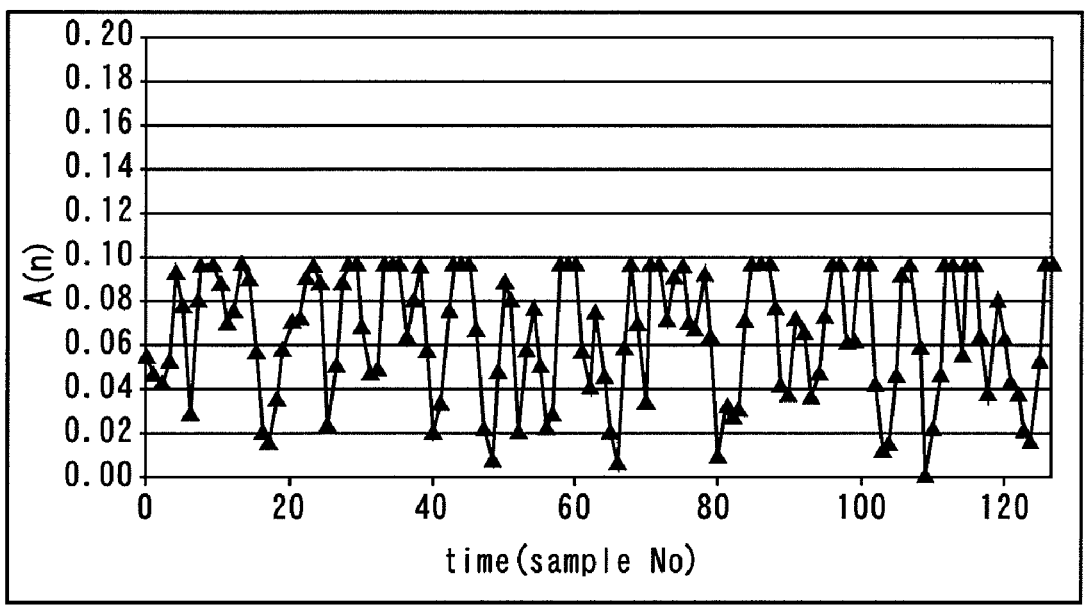
FIG. 11 shows a diagram representing a signal (the main signal S*(n)) in which the clip signal Clip(k) is clipped from the OFDM signal shown in FIG. 10.

FIG. 11 shows an amplitude of the identical OFDM signal within a limiter output (CR=1.8 dB or an amplitude scale of about 0.1) as a function derived from the OFDM sample number n. That is, FIG. 11 shows the OFDM signal S*(n) outputted from the limiter 104 after clipping.

Figure 12:
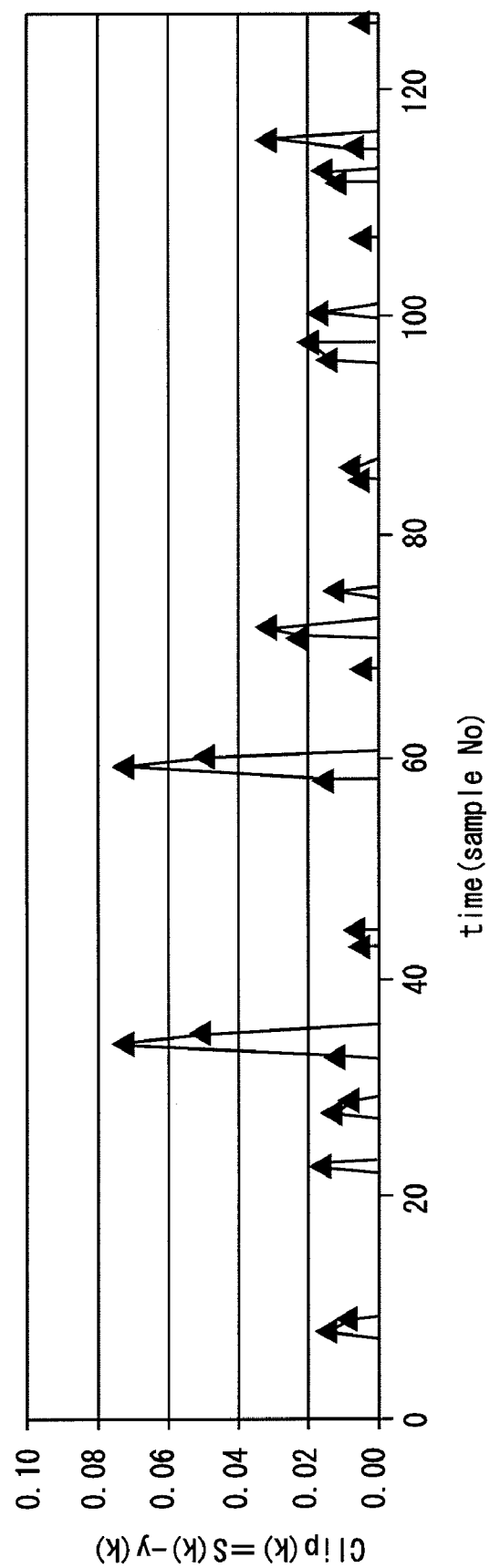
FIG. 12 shows a diagram representing the clip signal Clip (k) clipped from the OFDM signal S(n) shown in FIG. 10.

FIG. 12 shows an amplitude of the clip signal Clip(n) outputted from the limiter 104. As shown in FIG. 12, the clip signal contains only a portion clipped from the OFDM signal S(n), so most part thereof is composed of zero value samples. A relative amount of samples having a non-zero amplitude (i.e., ratio of non-zero value samples to the total number of samples contained in the clip signal) is extremely small. In the example of FIG. 6, the relative amount is indicated as several percent. As shown in FIG. 6, the higher the clipping level CR becomes, the larger the zero value samples of the clip signal become in number. That is, there is a proportional relationship between the value of the clipping level CR and the number of zero sample values. Thus, the clipping level CR defines the number of non-zero samples contained in the clip signal.

In the high-pass filtering process performed by the HPF 105, the multiplication process relating to the above-mentioned zero sample values is omitted under multiplication control of the SZML section 106. The number of multiplications required for individually filtering clip signals (FIG. 12) at the HPF 105 can be reduced to about one tenth of that in the case where an OFDM signal as shown in FIG. 11 is subjected to the low-pass filtering (FIG. 2).

Accordingly, it is possible to greatly relax requirements of hardware and software for implementing the LPF for PAPR reduction included in the OFDM transmitter. In other words, by reducing the number of multiplications required for a filtering process, simplification of the filtering process may be achieved. This simplification may lead to at least one of simplification and size-reduction of hardware and software. In addition, it is possible to shorten the time necessary for a single filtering process.

Note that the embodiment has been described above by illustrating the example in which the OFDM is employed as a modulation scheme for an input data stream, but the modulation scheme employed by the present invention is not limited to the OFDM. Alternatively, the present invention may be applied to transmitters adopting various modulation schemes that require power amplification.

<Others>

The disclosures of Japanese patent application No. JP2006-324736 filed on Nov. 30, 2006 including the specification, drawings and abstract are incorporated herein by reference.

What is claimed is:

1. A transmitter, comprising:
a limiter performing clipping in which an amplitude part at a level higher than an amplitude level based on a predetermined clipping level is clipped from an input signal, separating the input signal into an input signal after the clipping, which contains a predetermined out-of-band component, and a clip signal from the input signal through the clipping, and outputting the input signal after the clipping and the clip signal;
a high-pass filter subjecting the clip signal inputted from the limiter to high-pass filtering for blocking an in-band component contained in the clip signal while passing an out-of-band component contained in the clip signal, which is opposite in phase to the out-of-band component contained in the input signal after the clipping;
an adder performing an addition process on the out-of-band component received from the high-pass filter and the input signal after the clipping received from the limiter; and
an amplifier performing power amplification on a signal outputted from the adder, and outputting the amplified signal.

2. A transmitter according to claim 1, wherein:
the clip signal contains sample values indicating amplitude values at a plurality of sample points;
the high-pass filter is configured to perform a high-pass filtering process including an addition process of adding a plurality of multiplication results after performing a multiplication process of multiplying each sample value by a predetermined weighting factor; and
the transmitter further comprises a multiplication control section controlling the high-pass filter to perform the multiplication process so that the multiplication process relating to a zero sample value is avoided in the high-pass filtering process.

3. A transmitter according to claim 2, wherein the high-pass filter performs the multiplication process using the weighting factor only on a non-zero sample value contained in the clip signal.

4. A transmitter according to claim 2, wherein the clipping level defines the number of non-zero sample values contained in the clip signal.

5. A transmitter according to claim 1, wherein the input signal after the clipping is outputted from the adder substantially without frequency distortion.

6. A method of suppressing out-of-band power for a transmission signal by using a transmitter, comprising:
performing clipping in which an amplitude part at a level higher than an amplitude level based on a predetermined clipping level is cut out from an input signal to be transmitted, separating the input signal into an input signal after the clipping, which contains a predetermined out-of-band component, and a clip signal cut out from the input signal through the clipping, and outputting the input signal after the clipping and the clip signal;
performing high-pass filtering for blocking an in-band component contained in the clip signal while passing an out-of-band component contained in the clip signal, which is opposite in phase to the out-of-band component contained in the input signal after the clipping;

performing an addition process on the out-of-band component obtained in the performing of the high-pass filtering and the received input signal after the clipping; and performing power amplification on a signal obtained in the performing of the addition process, and outputting the amplified signal.

7. A method of suppressing out-of-band power for a transmission signal by using a transmitter according to claim 6, wherein:

the clip signal contains sample values indicating amplitude values at a plurality of sample points;

the performing of the high-pass filtering process includes performing an addition process of adding a plurality of multiplication results after performing a multiplication process of multiplying each sample value by a predetermined weighting factor; and the method further comprises controlling the multiplication process to be performed so that the multiplication process relating to a zero sample value is avoided in the high-pass filtering process.

* * * * *